United States Patent
Kim et al.

(10) Patent No.: US 10,686,069 B2
(45) Date of Patent: Jun. 16, 2020

(54) SEMICONDUCTOR DEVICE HAVING VERTICAL CHANNEL

(71) Applicant: Samsung Electronics Co., Ltd., Suwon-si, Gyeonggi-do (KR)

(72) Inventors: Shin Hye Kim, Suwon-si (KR); Kyung Seok Oh, Seoul (KR); Gu Young Cho, Seoul (KR); Sang Jin Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/028,083

(22) Filed: Jul. 5, 2018

(65) Prior Publication Data
US 2019/0157452 A1 May 23, 2019

(30) Foreign Application Priority Data
Nov. 21, 2017 (KR) .................. 10-2017-0155546

(51) Int. Cl.

| H01L 29/78 | (2006.01) |
|---|---|
| H01L 29/10 | (2006.01) |
| H01L 23/532 | (2006.01) |
| H01L 29/423 | (2006.01) |
| H01L 29/786 | (2006.01) |
| H01L 29/66 | (2006.01) |
| H01L 29/08 | (2006.01) |
| H01L 21/768 | (2006.01) |

(52) U.S. Cl.
CPC ...... *H01L 29/7827* (2013.01); *H01L 23/5329* (2013.01); *H01L 29/1033* (2013.01); *H01L 29/4232* (2013.01); *H01L 29/66666* (2013.01); *H01L 29/78642* (2013.01); *H01L 21/76837* (2013.01); *H01L 29/0847* (2013.01); *H01L 29/6656* (2013.01)

(58) Field of Classification Search
CPC ............ H01L 27/2436; H01L 27/2454; H01L 29/7831; H01L 29/78642; H01L 29/78645; H01L 29/78648
See application file for complete search history.

(56) References Cited

U.S. PATENT DOCUMENTS

| 7,829,419 B2 | 11/2010 | Tanaka |
| 8,097,513 B2 | 1/2012 | Hong et al. |
| 8,497,548 B2 | 7/2013 | Masuoka et al. |
| 8,643,108 B2 | 2/2014 | Rahim et al. |
| 9,337,306 B2 | 5/2016 | Peng et al. |
| 9,543,401 B2 | 1/2017 | Kim et al. |

(Continued)

FOREIGN PATENT DOCUMENTS

| JP | 2013-069770 | 4/2013 |
| KR | 1011201810000 | 2/2012 |

*Primary Examiner* — Jae Lee
(74) *Attorney, Agent, or Firm* — Sughrue Mion, PLLC

(57) ABSTRACT

A semiconductor device includes a substrate and a plurality of semiconductor fins protruding from the substrate. Source/drain regions are disposed at tops of respective ones of the semiconductor fins, each having a width greater than a width of individual ones of the semiconductor fins. A gate electrode is disposed on side surfaces of the semiconductor fins below the source/drain regions. Insulating layers contact the side surfaces of the semiconductor fins and cover upper surfaces of the gate electrode.

14 Claims, 13 Drawing Sheets

(56) References Cited

U.S. PATENT DOCUMENTS

| | | |
|---|---|---|
| 9,647,123 B1 | 5/2017 | Balakrishnan et al. |
| 9,960,272 B1* | 5/2018 | Bao ..................... H01L 29/7827 |
| 2010/0181615 A1 | 7/2010 | Ikebuchi |
| 2016/0190312 A1 | 6/2016 | Zhang et al. |
| 2017/0133513 A1 | 5/2017 | Hong et al. |
| 2018/0047828 A1* | 2/2018 | Gluschenkov .... H01L 29/66666 |
| 2019/0067474 A1* | 2/2019 | Wong ................. H01L 29/7827 |
| 2019/0097024 A1* | 3/2019 | Li ..................... H01L 29/66666 |
| 2019/0103319 A1* | 4/2019 | Qi ................... H01L 21/823456 |

\* cited by examiner

A

SEMICONDUCTOR DEVICE HAVING VERTICAL CHANNEL

CROSS-REFERENCE TO RELATED APPLICATION

This application claims priority to Korean Patent Application No. 10-2017-0155546 filed on Nov. 21, 2017 in the Korean Intellectual Property Office, the disclosure of which is incorporated herein by reference in its entirety.

FIELD

The present inventive concept relates to semiconductor devices and, more particularly, to semiconductor devices having a vertical channel.

BACKGROUND

Multigate field effect transistors (FET) have an active pattern with a fin or nanowire shape, capable of suppressing a short channel effect, and have been proposed as a scaling technique for increasing the density of semiconductor devices. A transistor structure having a channel region vertically disposed on a substrate and a transistor structure having a channel region disposed horizontally on a substrate have been proposed.

SUMMARY

Some embodiments of the present inventive concept may provide a semiconductor device having a vertical channel with improved resistance characteristics. Some embodiments of the present inventive concept may provide methods of manufacturing a semiconductor device in which contamination of epitaxial process equipment by a gate electrode material may be reduced or prevented in a process of epitaxially growing a semiconductor layer for a source/drain.

According to some embodiments of the present inventive concept, a semiconductor device includes a substrate and a plurality of semiconductor fins protruding from the substrate. Source/drain regions are disposed at tops of respective ones of the semiconductor fins, each having a width greater than a width of individual ones of the semiconductor fins. A gate electrode is disposed on side surfaces of the semiconductor fins below the source/drain regions. Insulating layers contact the side surfaces of the semiconductor fins and cover upper surfaces of the gate electrode.

According to further embodiments, a semiconductor device includes a substrate and a semiconductor fin protruding from the substrate. A semiconductor layer is disposed on a top of the semiconductor fin. A gate electrode is disposed on a side surface of the semiconductor fin. A spacer is in contact with the side surface of the semiconductor fin between the semiconductor layer and an upper surface of the gate electrode.

According to still further embodiments, a semiconductor device includes a substrate including a first region and a second region, first semiconductor fins protruding from the first region of the substrate, and second semiconductor fins protruding from the second region of the substrate. Respective first semiconductor layers are disposed at tops of the first semiconductor fins, each having a width greater than a width of individual ones of the first semiconductor fins. Respective second semiconductor layers are disposed on the second semiconductor fins, each having a width greater than a width of individual ones of the second semiconductor fins. A first gate electrode is disposed on side surfaces of the first semiconductor fins below the first semiconductor layers. A second gate electrode is disposed on side surfaces of the second semiconductor fins below the second semiconductor layer. First spacers contact the side surfaces of the first semiconductor fins and cover upper surfaces of the first gate electrode. Second spacers contact the side surfaces of the second semiconductor fins and cover upper surfaces of the second gate electrode. A vertical length of the first gate electrode is less than a vertical length of the second gate electrode, and a thickness of each of the first spacers is identical to a thickness of each of the second spacers.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
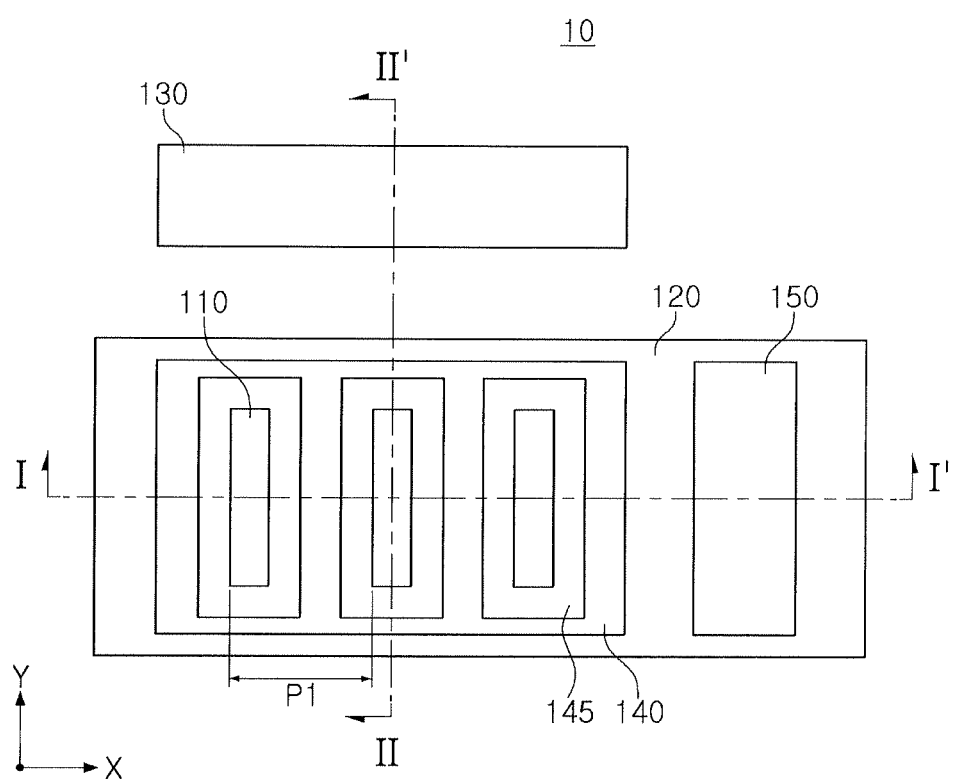
FIG. 1 is a layout diagram of a semiconductor device according to some example embodiments of the present inventive concept.
Figure 2:
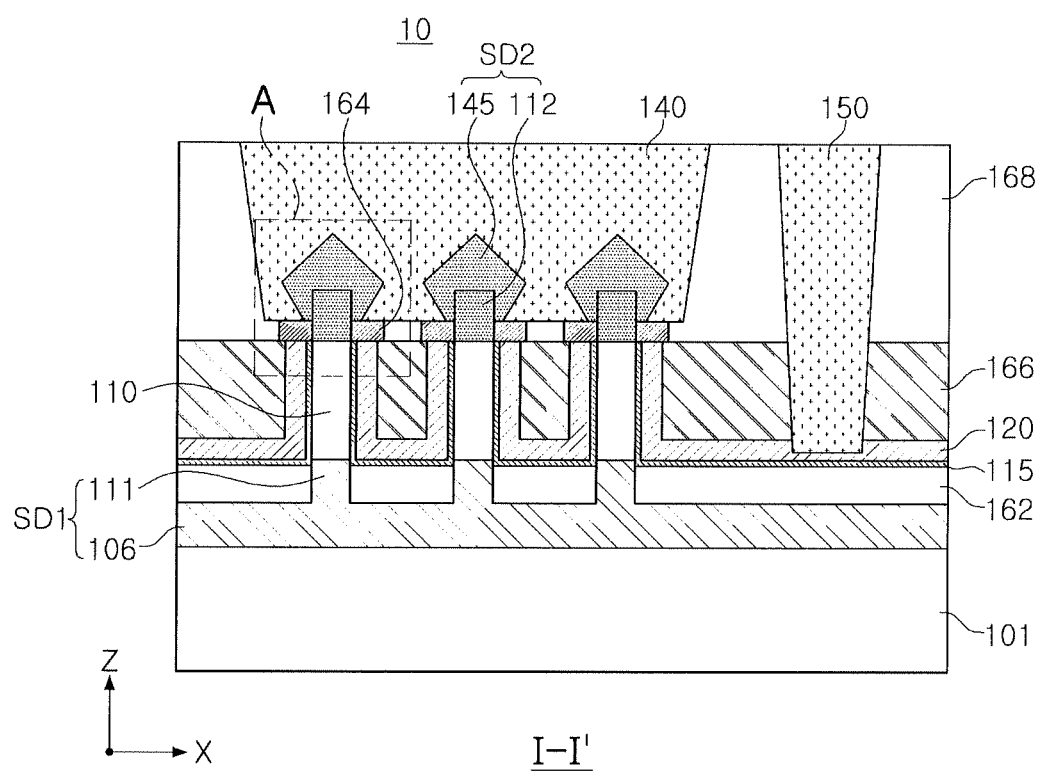
FIG. 2 is a cross-sectional view of the semiconductor device taken along line I-I' of FIG. 1.

FIG. 1 is a layout diagram of a semiconductor device 10 according to some example embodiments. FIG. 2 is a cross-sectional view of the semiconductor device 10, taken along line I-I' of FIG. 1, and FIG. 3 is a cross-sectional view of the semiconductor device 10, taken along line of FIG. 1.

Figure 3:
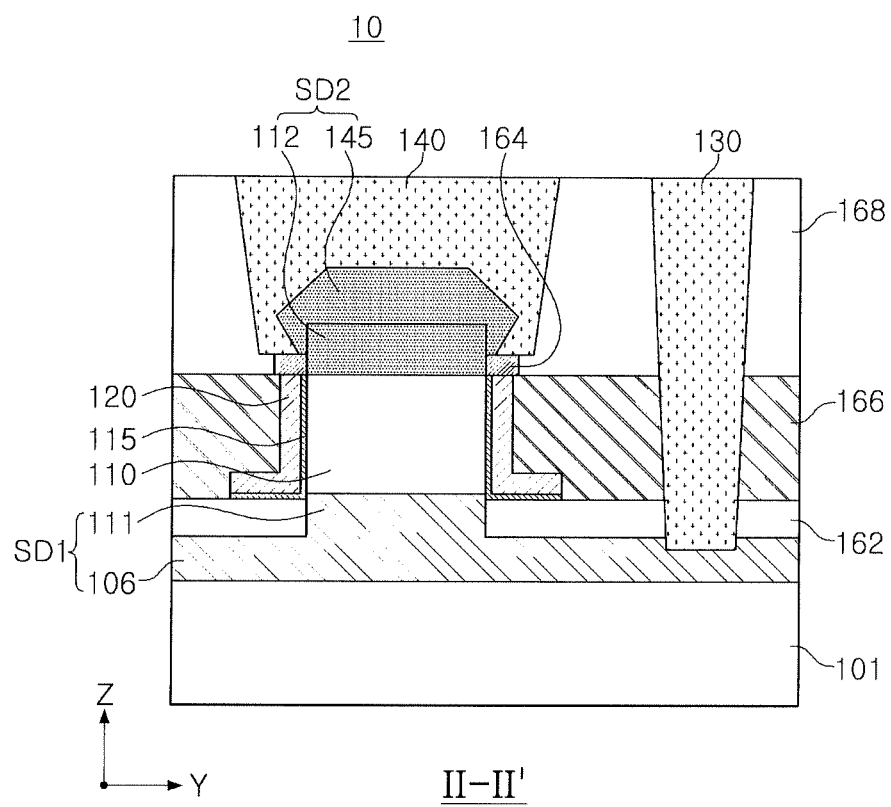
FIG. 3 is a cross-sectional view of the semiconductor device taken along line II-II' of FIG. 1.

Referring to FIGS. 1 to 3, the semiconductor device 10 may include a vertical field effect transistor. The vertical field effect transistor may be a vertical gate all around (GAA) field effect transistor.

A substrate 101 may include a semiconductor material, such as a group IV semiconductor material, a group III-V compound semiconductor material, or a group II-VI compound semiconductor material. The substrate 101 may be a silicon-on-insulator (SOI) substrate.

The semiconductor device 10 may include active fins 110 protruding in a direction perpendicular to an upper surface of the substrate 101 and providing vertical channel regions, lower source/drains SD1 and upper source/drains SD2 disposed below and on the active fins 110, respectively. A gate electrode 120 is disposed between the upper source/drains SD2 and the lower source/drains SD1, on the active fins 110.

The gate electrode 120 may be disposed around the active fins 110 to laterally surround the vertical channel regions. The semiconductor device 10 may include a first insulating layer 162 disposed between the gate electrode 120 and the substrate 101, and a second insulating layer 164 disposed between the gate electrode 120 and the upper source SD2. The first insulating layer 162 may be referred to as a lower spacer, and the second insulating layer 164 may be referred to as an upper spacer.

The active fins 110 may have a sheet shape in which a width in one direction and a width in the other direction are different. The active fins 110 may have a sheet shape of which a width in a Y direction is greater than a width in an X direction. The active fins 110 may be spaced apart from one another. For example, a pitch P1 of the active fins 110 may be 40 nm or less, and the width of each of the active fins 110 in the X direction may be 10 nm or less. In some embodiments, the active fins 110 may have a cylindrical or polyprismatic shape.

Although FIGS. 1 and 2 illustrate three active fins 110, the number of the active fins 110 is not limited to that illustrated in the drawings. In some embodiments, a vertical field effect transistor may include one or two active fins 110. In some embodiments, a vertical field effect transistor may include four or more active fins 110. The number of components associated with the active fin 110 may also be changed, depending on the number of active fins 110.

The gate electrode 120 may include vertical portions covering sides of the active fins 110, and a horizontal portion extending horizontally from the vertical portions along the upper surface of the substrate 101. The gate electrode 120 may include a plurality of conductive layers. The gate electrode 120 may include, for example, TiN, WN, TiAl, TiAlN, TaN, TiC, TaC, TiAlC, TaCN, TaSiN, W, Co, Cu, Al, Ti, Ta, or combinations thereof.

A gate dielectric layer 115 may be disposed between the gate electrode 120 and the active fins 110. The gate dielectric layer 115 may include an interfacial dielectric layer 114 and a high-dielectric constant layer 116 (see FIG. 4). The high-dielectric constant layer 116 may also be disposed between the gate electrode 120 and the substrate 101. The gate dielectric layer 115 may contact lower surfaces of the second insulating layers 164.

The lower source/drain SD1 may include lower regions 111 of the fins 110 and an impurity region 106. The lower extension regions 111 may be connected to each other by the impurity region 106 formed in an upper region of the substrate 101. The lower source/drain SD1 may be doped with, for example, an n-type impurity or a p-type impurity. The lower regions 111 and the impurity region 106 may be doped with, for example, an n-type impurity or a p-type impurity.

The upper source/drain SD2 may include upper regions 112 of the fins 110 and semiconductor layers 145. The semiconductor layers 145 may be formed from on the active fins 110 by a selective growth process. The semiconductor layers 145 may have a width greater than a width of each of the active fins 110. The upper source/drain SD2 may be doped with an impurity of the same conductivity type as the lower source/drain SD1. The upper regions 112 and the semiconductor layers 145 may be doped with impurities of the same conductivity type as the lower regions 111 and the impurity region 106.

The second insulating layers 164 may contact side surfaces of the active fins 110 above an upper surface of the gate electrode 120, and may cover the gate electrode 120 to prevent exposure of the gate electrode 120. In particular, the second insulating layers 164 may cover the upper surfaces of the vertical portions of the gate electrode 120. Upper surfaces of the second insulating layers 164 may contact lower surfaces of the semiconductor layers 145.

The semiconductor device 10 may further include a gap fill insulating layer 166 covering the gate electrode 120. The gap fill insulating layer 166 may cover the vertical portions and the horizontal portion of the gate electrode 120. An upper surface of the gap fill insulating layer 166 may be coplanar with upper surfaces of the vertical portions of the gate electrode 120. The upper surfaces of the second insulating layers 164 may be higher than the upper surface of the gap fill insulating layer 166.

The semiconductor device 10 may include an upper contact plug 140 penetrating through an interlayer insulating layer 168 to contact the semiconductor layers 145 of the upper source/drain SD2. A lower surface of the upper contact plug 140 may contact the second insulating layer 164. The semiconductor device 10 may include a lower contact plug 130 penetrating through the interlayer insulating layer 168, the gap fill insulating layer 166 and the first insulating layer 162, to contact the impurity region 106 of the substrate 101. A gate contact plug 150 penetrates through the interlayer insulating layer 168 and the gap fill insulating layer 166 to contact the gate electrode 120.

Figure 4:
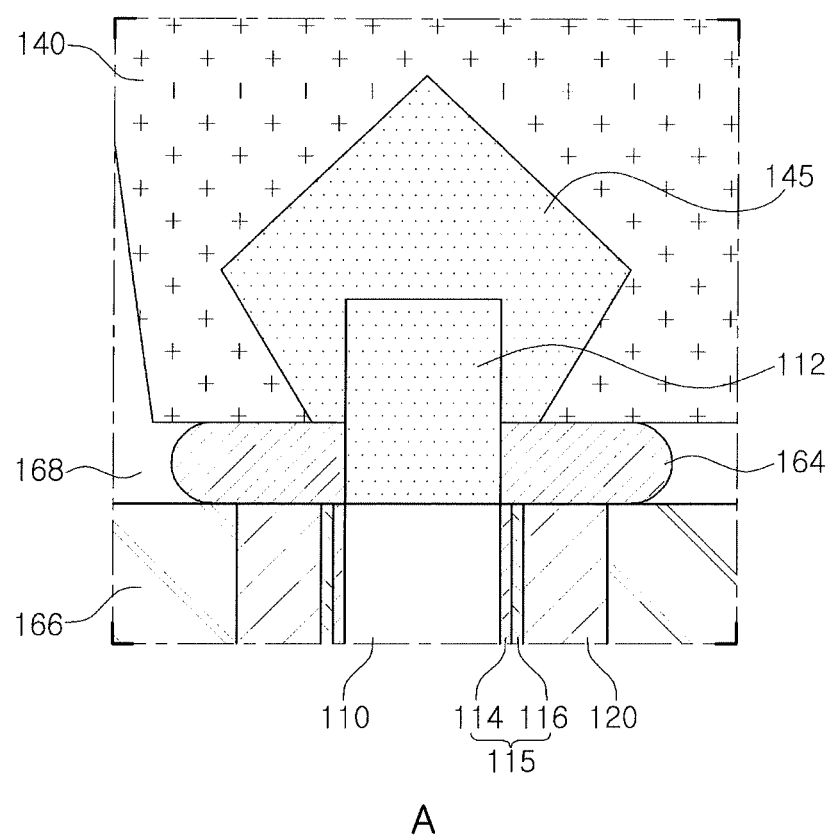
FIG. 4 is an enlarged cross-sectional view of region A' of FIG. 2.

FIG. 4 is an enlarged cross-sectional view of region A' of FIG. 2. Each of the second insulating layers 164 may have a side surface extending beyond a side surface of the gate electrode 120. The side surfaces of the second insulating layers 164 may be convex curved surfaces.

The gate dielectric layer 115 may include the interfacial dielectric layer 114 and the high-dielectric constant layer 116. The high-dielectric constant layer 116 may also be disposed between the gate electrode 120 and the substrate 101. The interfacial dielectric layer 114, the high-dielectric constant layer 116, and the gate electrode 120 may contact the lower surface of the second insulating layer 164. A portion of the gap fill insulating layer 166 may also contact the lower surface of the second insulating layer 164.

The interfacial dielectric layer 114 may be formed of, for example, silicon oxide. The high-dielectric constant layer 116 may include a high-k dielectric having a dielectric constant higher than that of silicon oxide. For example, the high-k dielectric may be formed of at least one of hafnium oxide (HfOx), hafnium silicate (HfSiOx), hafnium oxide nitride (HfON), hafnium silicon oxide nitride (HfSiON), lanthanum oxide (LaOx), lanthanum oxide nitride (LaON), lanthanum aluminum oxide (LaAlOx), zirconium oxide (ZrOx), zirconium silicate (ZrSiOx), zirconium oxide nitride (ZrON), zirconium silicon oxynitride (ZrSiON), tantalum oxide (TaOx), titanium oxide (TiOx), titanium oxynitride (TiON), barium strontium titanium oxide (BaSrTiOx), barium titanium oxide (BaTiOx), strontium titanium oxide (SrTiOx), yttrium oxide (YOx), aluminum oxide (AlOx), aluminum oxynitride (AlON), or lead scandium tantalum oxide (PbScTaOx).

Figure 5:
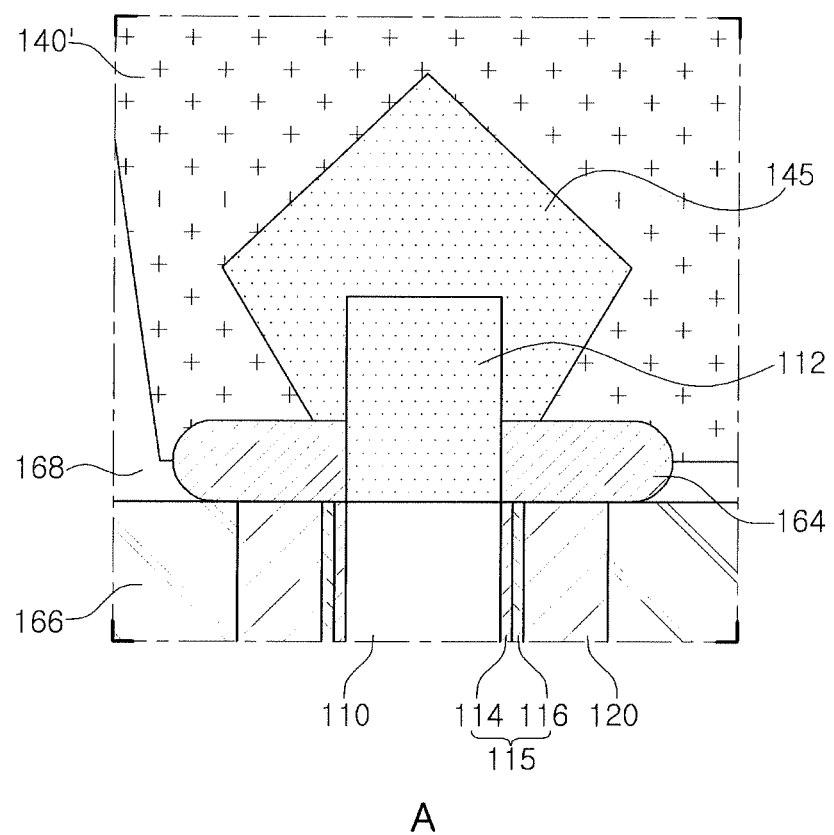
FIGS. 5 and 6 are cross-sectional views illustrating example embodiments of the present inventive concept.
Figure 6:
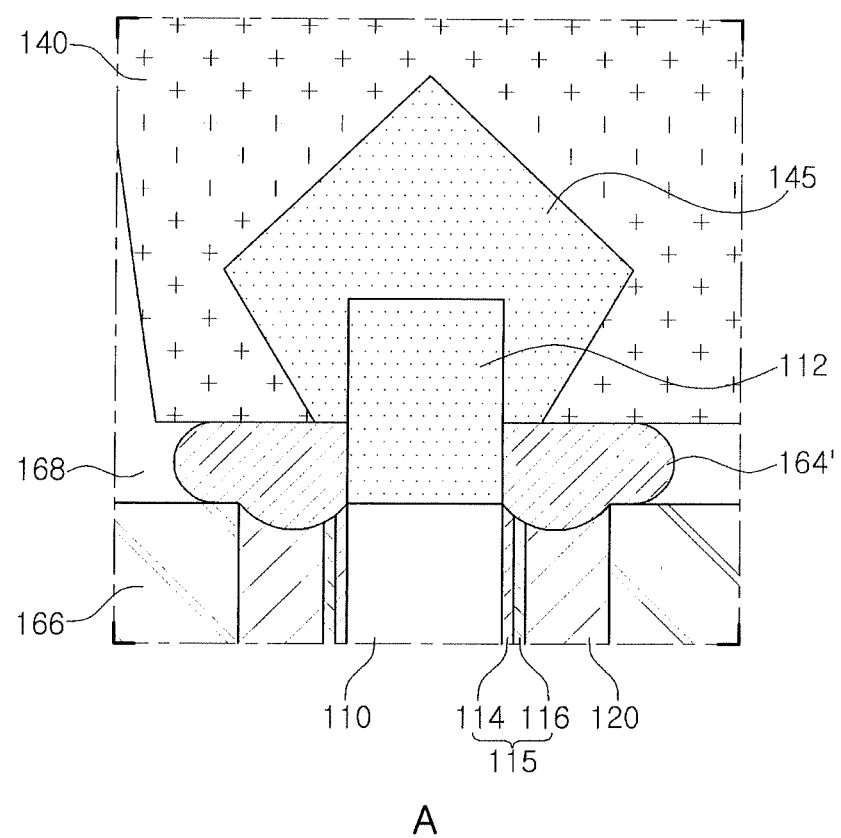

FIGS. 5 and 6 are cross-sectional views illustrating further example embodiments. Referring to FIG. 5, a lower surface of an upper contact plug 140' may be lower than an upper surface of the second insulating layer 164, in a manner different from FIG. 4. The lower surface of the upper contact plug 140' may contact the upper surfaces of the second insulating layers 164 and the side surfaces of the second insulating layers 164.

Referring to FIG. 6, in a manner different from FIG. 4, second insulating layers 164' may include convex portions extending into and contacting gate electrodes 120. The upper surfaces of the gate electrodes 120 may have corresponding concave portions.

Figure 7:
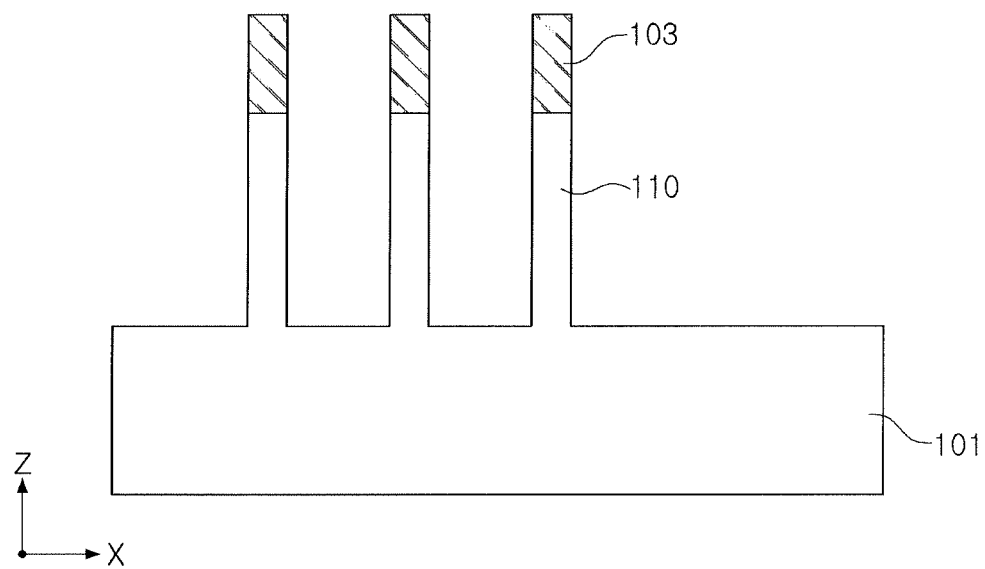
FIGS. 7 to 15 are cross-sectional views illustrating operations for manufacturing a semiconductor device according to some example embodiments of the present inventive concept.

FIGS. 7 to 15 are cross-sectional views of operations for manufacturing a semiconductor device according to some example embodiments. Referring to FIG. 7, active fins 110 may be formed on a substrate 101. The active fins 110 may be formed by anisotropically etching the substrate 101 using, for example, a double patterning technology (DPT) or quadruple patterning technology (QPT). A hard mask layer 103 may remain on the active fins 110. A pitch of the active fins 110 may be, for example, 40 nm or less, and a width of each of the active fins 110 may be 10 nm or less, for example.

Figure 8:
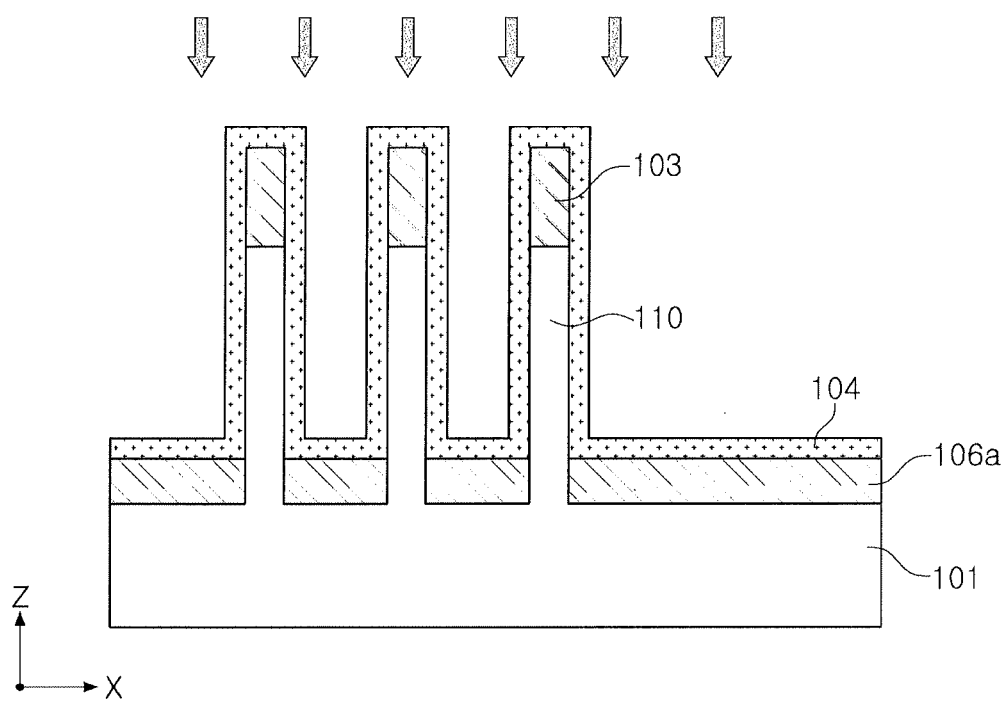

Referring to FIG. 8, a preliminary impurity region 106a may be formed at an upper region of the substrate 101 by an ion implantation process. Before the ion implantation process is performed, a buffer layer 104 covering an upper surface of the substrate 101 and the fins 110 may be formed.

Figure 9:
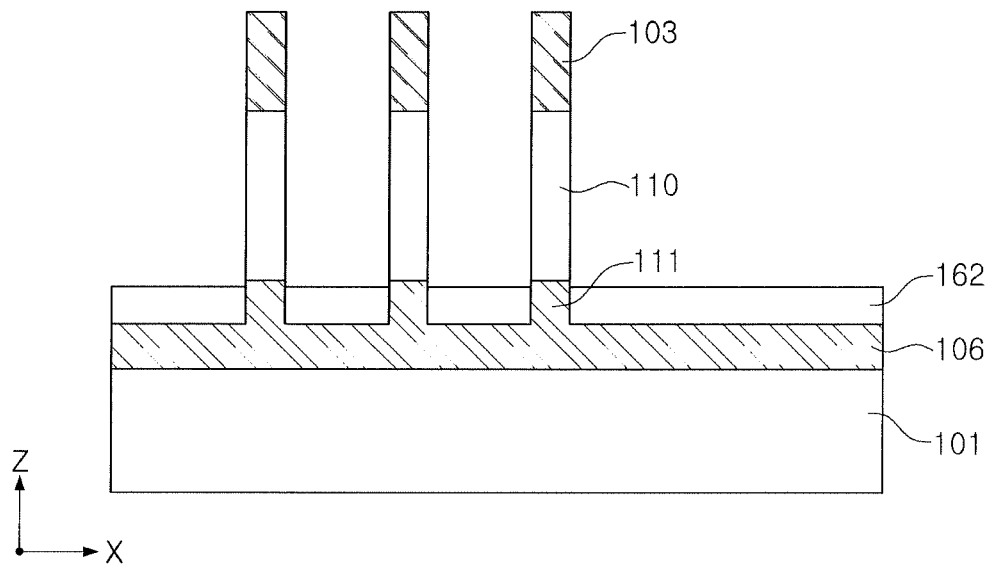

Referring to FIG. 9, an impurity region 106 may be formed in an upper portion of the substrate 101 and lower impurity regions 111 may be formed in the active fins 110. The impurity region 106 and the lower regions 111 may be, for example, regions doped with an n-type impurity or a p-type impurity. The impurity region 106 may connect the lower regions 111 to each other. A heat treatment process in which impurities may be activated and diffused may be performed to form the impurity region 106 and the lower regions 111.

Subsequently, a first insulating layer 162 may be formed on the substrate 101 to cover lower portions of the active fins 110. For example, the first insulating layer 162 may be formed by depositing an insulating material by a high-density plasma chemical vapor deposition (HDP CVD) process and removing insulating material deposited on sidewalls of the active fins 110 by an isotropic etching process. The first insulating layer 162 may serve to electrically isolate a subsequently formed gate electrode from the substrate 101. The first insulating layer 162 may be referred to as a lower spacer.

Figure 10:
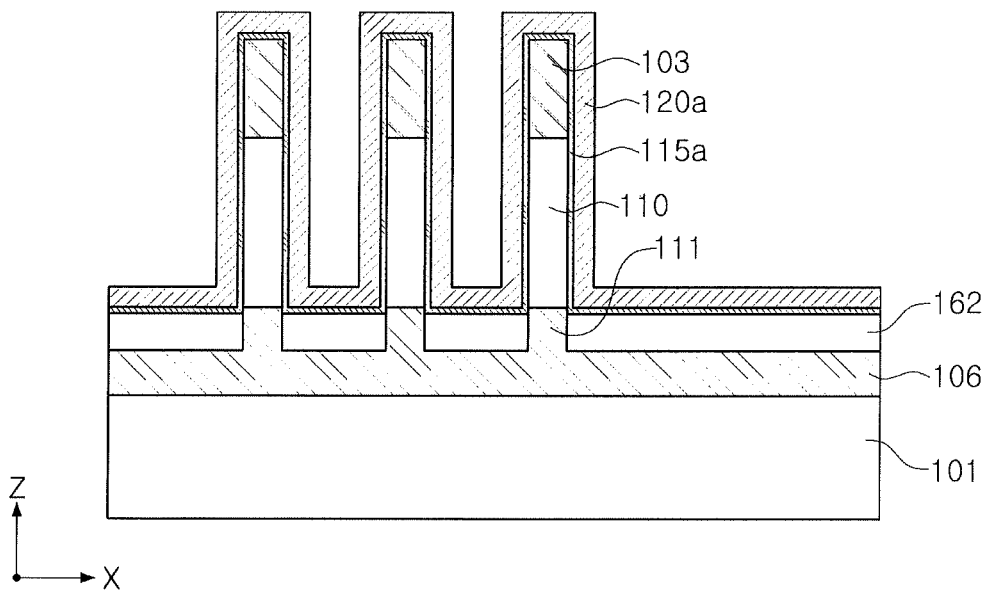

Referring to FIG. 10, a dielectric layer 115a and a conductive layer 120a may be sequentially formed to cover the active fins 110 and the first insulating layer 162. The dielectric layer 115a may be formed by forming an interfacial dielectric layer to cover sides of the active fins 110 and forming a high-dielectric constant layer on the interfacial dielectric layer and the first insulating layer 162. The interfacial dielectric layer may be formed by a separate oxidation process before forming the high-dielectric constant layer. In some embodiments, the interfacial dielectric layer may be formed by a process of forming the high-dielectric constant layer. The conductive layer 120a may include a plurality of conductive layers.

Figure 11:
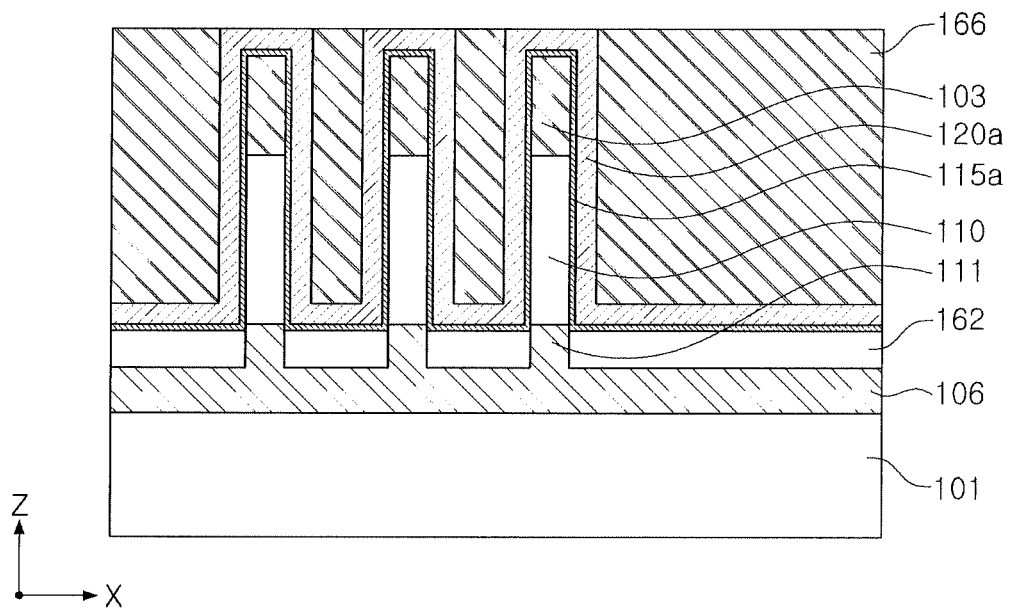

Referring to FIG. 11, a gap fill insulating layer 166 covering the conductive layer 120a may be formed. The gap fill insulating layer 166 may be formed by forming an insulating material to completely cover the conductive layer 120a and planarizing the insulating material to expose the conductive layer 120a. The gap fill insulating layer 164 may be formed of, for example, silicon nitride.

Figure 12:
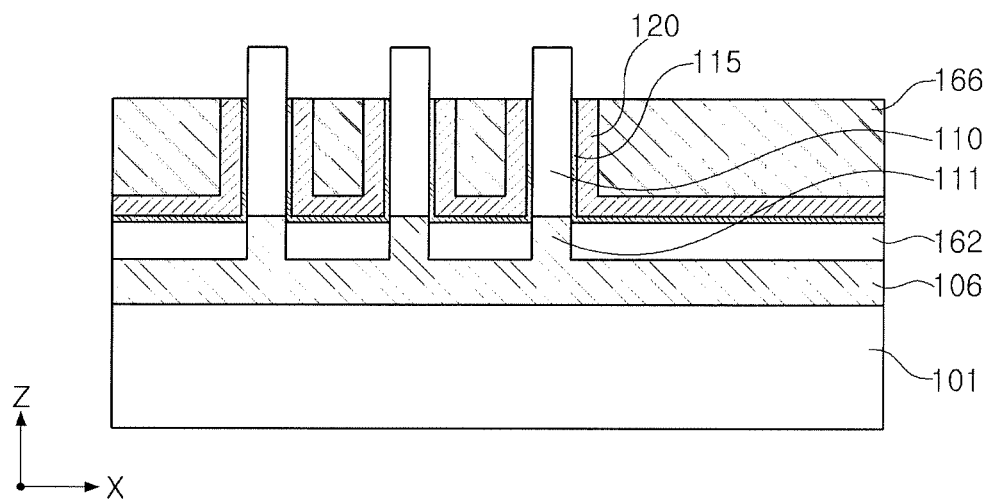

Referring to FIG. 12, the gate electrode 120 may formed by removing an exposed portion of the conductive layer 120 using a dry etching process. A portion of the gate dielectric layer 115 may also be removed. A portion of the gap fill insulating layer 164 may also be removed. The hard mask layer 103 may be completely removed.

Figure 13:
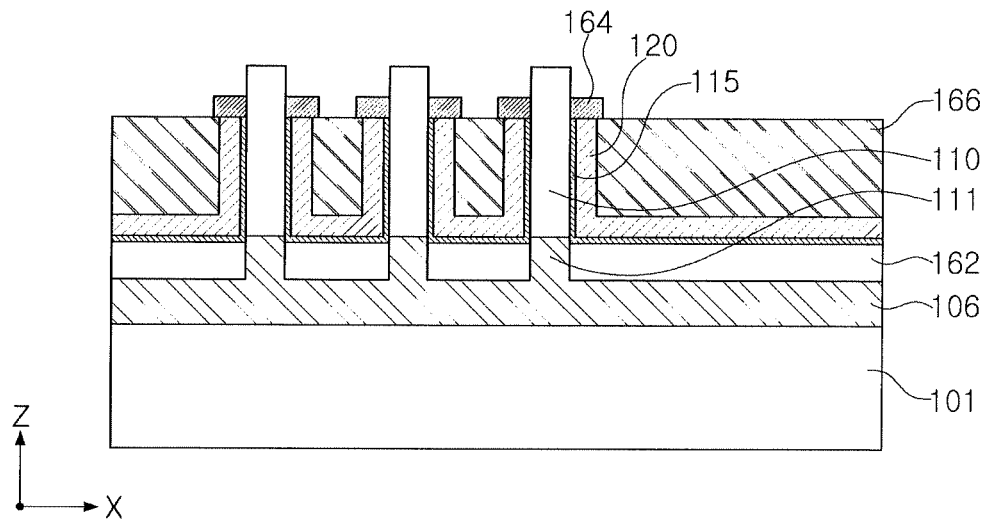

Referring to FIG. 13, second insulating layers 164 may be formed to cover an upper surface of the gate electrode 120. Using a selectively deposition process, the second insulating layers 164 may not be formed on a gap fill insulating layer 166 and the active fins 110. The second insulating layers 164 may be formed by selectively depositing an insulating material after an inhibitor is adsorbed onto surfaces of the gap fill insulating layer 166 and the active fins 110. The inhibitor may serve to prevent a source gas from being adsorbed on the surfaces of the gap fill insulating layer 166 and the active fins 110. After the second insulating layers 164 are formed, the inhibitor may be removed. The second insulating layers 164 may be formed of, for example, silicon nitride. In some embodiments, adjacent second insulating layers 164 may be in contact with each other.

Figure 14:
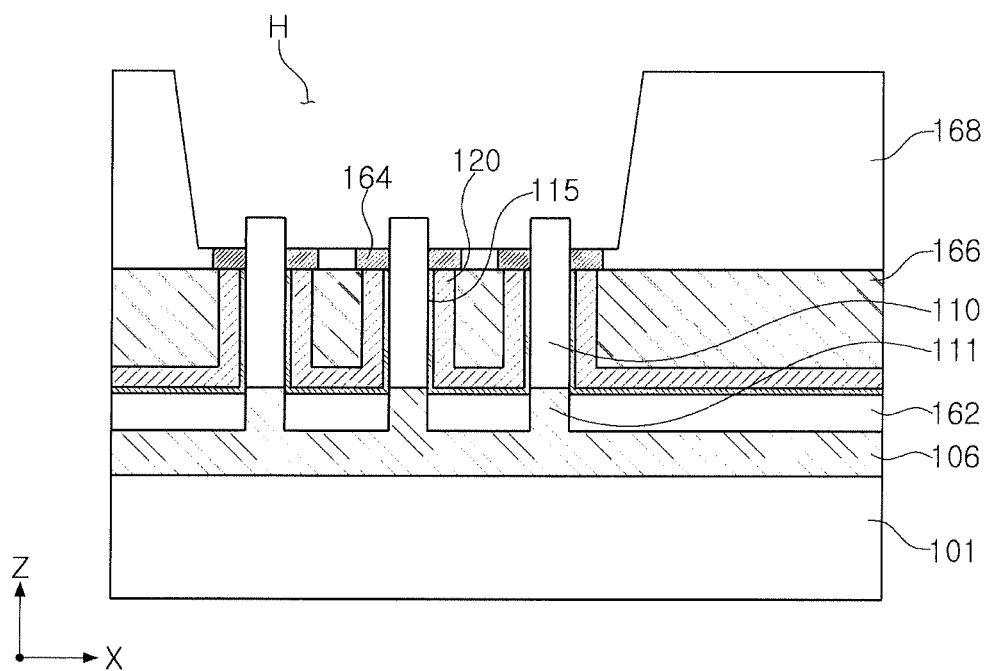

Referring to FIG. 14, an interlayer insulating layer 168 having a contact hole H therein may be formed. After the interlayer insulating layer 168 is formed, a portion of the interlayer insulating layer 168 may be removed by a photolithography process and an etching process, thereby forming a contact hole H.

The contact hole H may expose upper portions of the active fins 110 and upper surfaces of second insulating layers 164. In some example embodiments, the contact hole H may expose the upper surfaces of the second insulating layers 164 and portions of side surfaces of the second insulating layers 164.

The second insulating layer 164 may be formed of a material having etching selectivity with respect to an interlayer insulating layer 168, and may protect the gate electrode 120 during the etching process for the formation of the contact hole H. The second insulating layer 164 may be formed of, for example, silicon nitride, and the interlayer insulating layer 168 may be formed of, for example, silicon oxide. The second insulating layer 164 may serve as an etch stop layer in the process of etching the interlayer insulating layer 168 to form the contact hole H.

Figure 15:
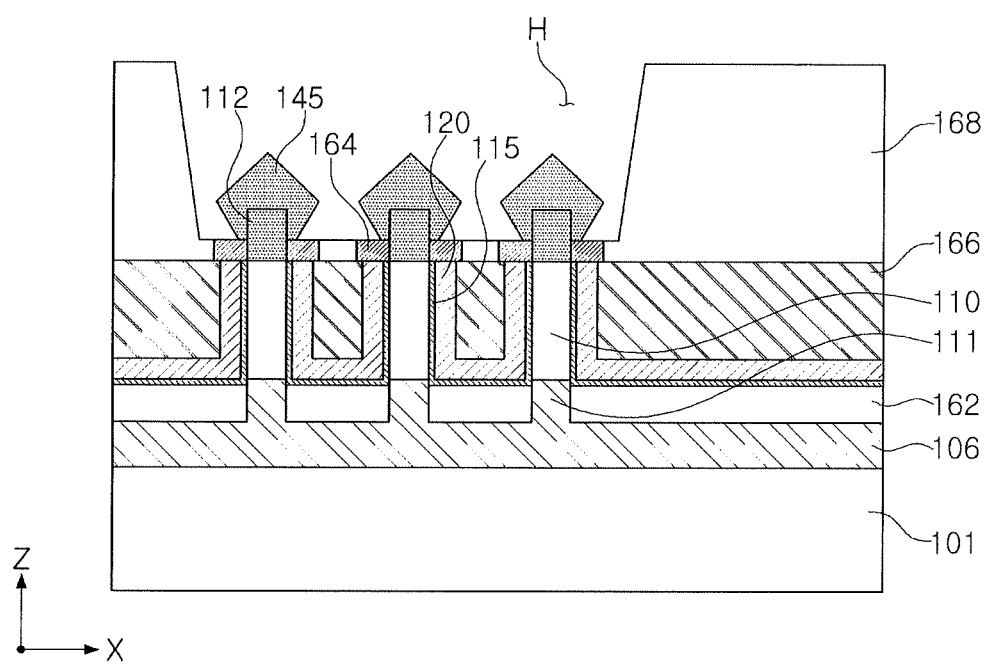

Referring to FIG. 15, semiconductor layers 145 may be formed on the active fins 110 exposed by the contact holes H. The semiconductor layers 145 may be grown from surfaces of the active fins 110 by a selective epitaxial growth (SEG) process. The semiconductor layers 145 may be doped with an impurity of the same conductivity type as that of an impurity region 106. The semiconductor layers 145 may be doped in-situ, during the selective epitaxial growth process. A heat treatment process may be performed to activate and diffuse the impurities. Upper regions 112 of the fins 110 may be doped by the heat treatment process. Alternatively, the upper regions 112 may be doped by ion implanting impurities before the semiconductor layers 145 are formed. In some embodiments, adjacent semiconductor layers 145 may be in contact with each other.

Referring again to FIGS. 2 and 3, a lower contact plug 130, an upper contact plug 140, and a gate contact plug 150 may be formed. The lower contact plug 130 may be connected to the impurity region 106 of the substrate 101, and the upper contact plug 140 may be connected to the semiconductor layers 145. The gate contact plug 150 may be connected to the gate electrode 120.

Figure 16:
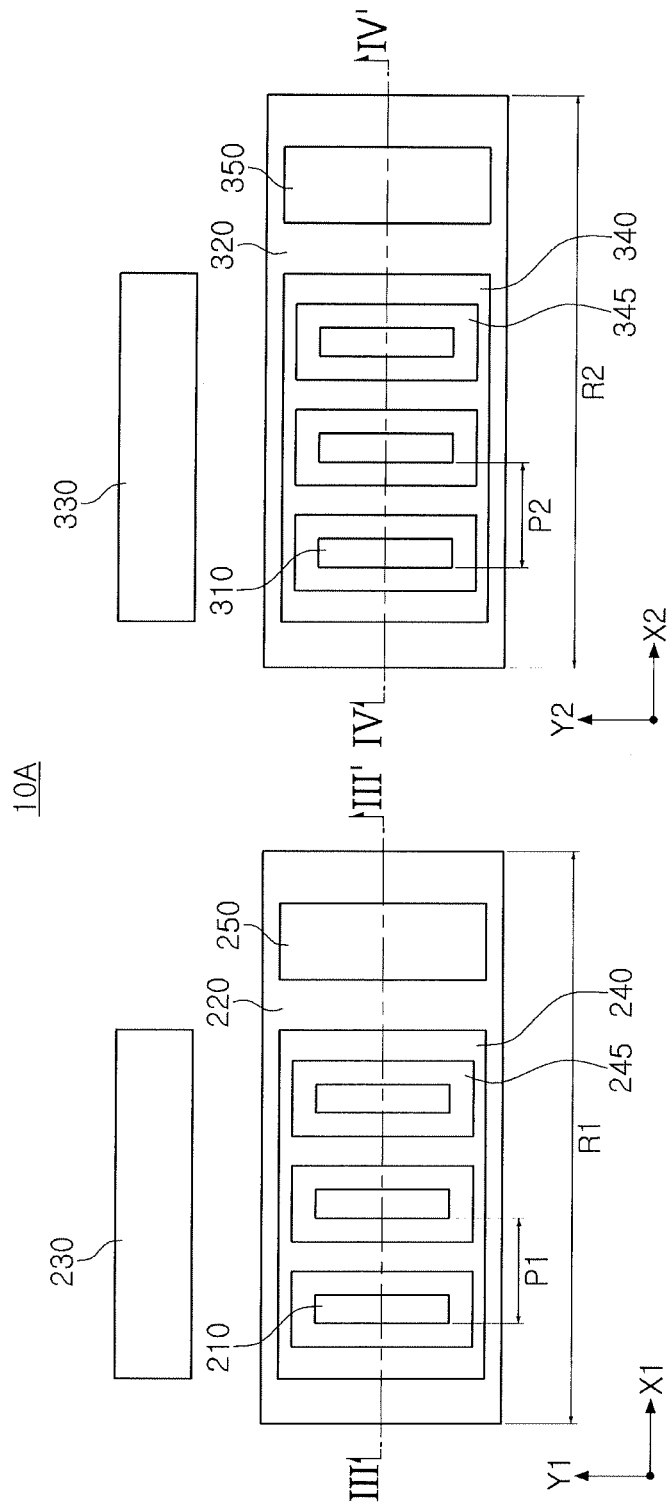
FIG. 16 is a layout diagram of a semiconductor device according to some example embodiments of the present inventive concept.
Figure 17:
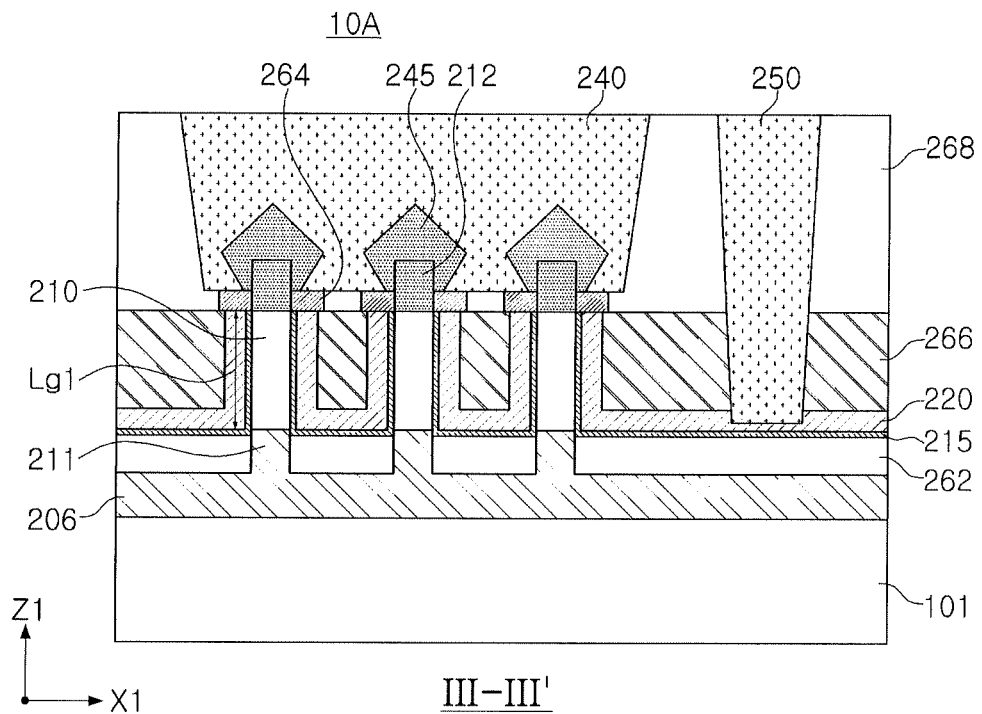
FIGS. 17 and 18 are cross-sectional views of a semiconductor device, taken along line and line IV-IV' of FIG. 16, respectively.
Figure 18:
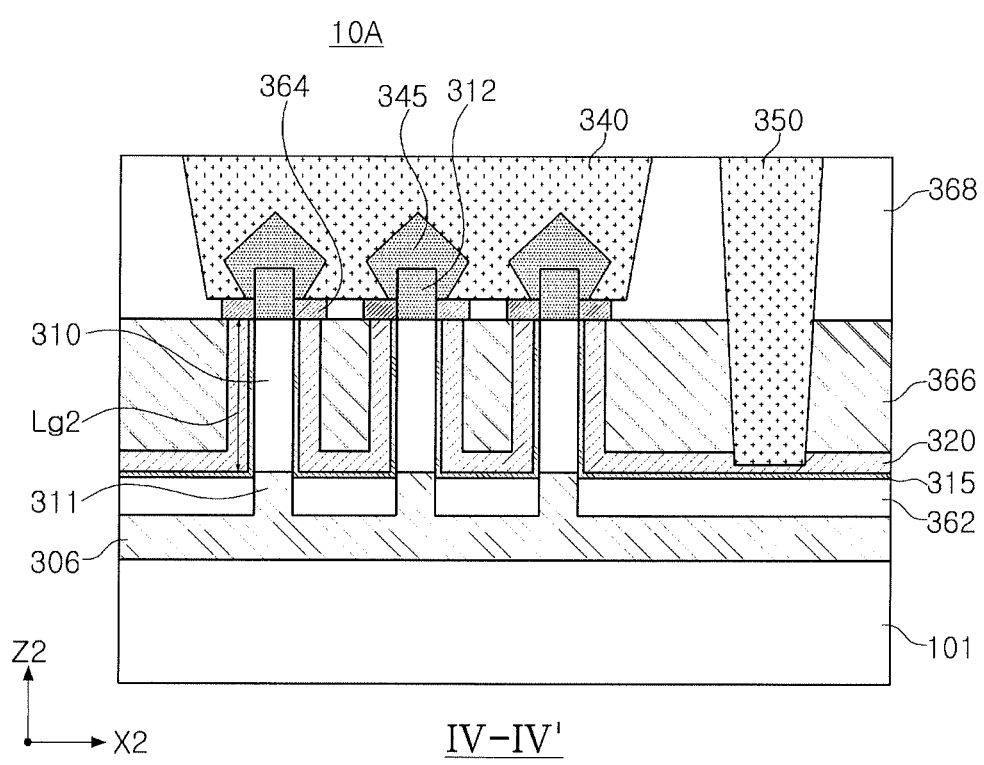

FIG. 16 is a layout diagram of a semiconductor device according to some example embodiments. FIGS. 17 and 18 provide cross-sectional views of the semiconductor device, taken along line III-III' and line IV-IV' of FIG. 16, respectively.

With reference to FIGS. 16-18, a semiconductor device 10A may include a substrate 101 having a first region R1 and a second region R2, first active fins 210 extending from a first region R1 of the substrate 101, second active fins 310 protruding from a second region R2 of the substrate 101, first semiconductor layers 245 disposed on the first active fins 210 and wider than each of the first active fins 210, second semiconductor layers 345 disposed on the second active fins 310 and wider than each of the second active fins 310, a first gate electrode 220 disposed below the first semiconductor layers 245 and surrounding the first active fins 210, a second gate electrode 320 disposed below the second semiconductor layers 345 and surrounding the second active fins 310, first upper spacers 264 contacting side surfaces of the first active fins 210 above an upper surface of the first gate electrode 220 and covering the first gate electrode 220 to prevent the first gate electrode 220 from being exposed, and second upper spacers 364 contacting side surfaces of the second active fins 310 above an upper surface of the second gate electrode 320, and covering the second gate electrode 320 to prevent the second gate electrode 320 from being exposed. A vertical length of the first active fins 210 may be less than a vertical length of the second active fins 310. A vertical length Lg1 of the first gate electrode 220 may be less than a vertical length Lg2 of the second gate electrode 320. A thickness of each of the first upper spacers 264 may be identical to a thickness of each of the second upper spacers 364. For example, the first region R1 may be a core region, and the second region R2 may be an input/output (I/O) circuit region. For example, the first region R1 and the second region R2 may be regions having different structures, formed due to variations in a manufacturing process. The first upper spacers 264 and the second upper spacers 364 may be similar to the second insulating layers 164 described above.

A first lower spacer 262 may be disposed between a first gate electrode 210 and a substrate 101, and a second lower spacer 362 may be disposed between a second gate electrode 310 and the substrate 101. A first impurity region 206 and lower regions 211 of the fins 210 may constitute a first lower source/drain, and a second impurity region 306 and lower regions of the fins 310 may constitute a second lower source/drain.

A first gate contact plug 250 may penetrate through a first interlayer insulating layer 268 and a first gap fill insulating layer 266 to contact the first gate electrode 210, and a second gate contact plug 350 may penetrate through a second interlayer insulating layer 368 and a second gap fill insulating layer 366 to contact the second gate electrode 310.

As set forth above, according to some example embodiments, a semiconductor device having a vertical channel with improved resistance may be provided.

According to some example embodiments, epitaxial processing equipment may be prevented from being contaminated by a gate electrode, in a process of epitaxially growing a semiconductor layer constituting upper source/drain.

While example embodiments have been shown and described above, it will be apparent to those skilled in the art that modifications and variations could be made without departing from the scope of the present inventive concept as defined by the appended claims.

What is claimed is:

1. A semiconductor device comprising:
a substrate;
a plurality of semiconductor fins protruding from the substrate;
source/drain regions disposed at tops of respective ones of the semiconductor fins and each having a width greater than a width of individual ones of the semiconductor fins;
a gate electrode disposed on side surfaces of the semiconductor fins below the source/drain regions;
insulating layers contacting the side surfaces of the semiconductor fins and covering upper surfaces of the gate electrode;
an interlayer insulator interposed between the insulating layers facing each other on the sidewalls of adjacent semiconductor fins; and
a contact plug connected to the source/drain regions,
wherein a lower surface of the contact plug is in contact with the insulating layers,
wherein upper regions of the gate electrode are spaced apart from each other, and wherein a width of each of the insulating layers is greater than a width of each of the upper regions of gate electrode, and
wherein the lower surface of the contact plug is lower than upper surfaces of the insulating layers.

2. The semiconductor device of claim 1, wherein the insulating layers extend horizontally from the side surfaces of the semiconductor fins to beyond the gate electrode.

3. The semiconductor device of claim 2, wherein side surfaces of the insulating layers are convex.

4. The semiconductor device of claim 1, wherein lower surfaces of the insulating layers contacting the gate electrode are convex.

5. The semiconductor device of claim 1, wherein the source/drain regions comprise semiconductor layers on the side surfaces of the semiconductor fins and wherein the upper surfaces of the insulating layers are in contact with the semiconductor layers.

6. The semiconductor device of claim 1, wherein the gate electrode comprises vertical portions on the side surfaces of the semiconductor fins and a horizontal portion extending horizontally from the vertical portions along an upper surface of the substrate.

7. The semiconductor device of claim 6, further comprising a gap fill insulating layer covering the vertical and horizontal portions of the gate electrode, wherein the upper surfaces of the insulating layers are higher than an upper surface of the gap fill insulating layer.

8. The semiconductor device of claim 7, wherein the upper surface of the gap fill insulating layer is coplanar with upper surfaces of the vertical portions of the gate electrode.

9. The semiconductor device of claim 1, further comprising a gate dielectric layer disposed between the gate electrode and the semiconductor fins and wherein the gate dielectric layer contacts lower surfaces of the insulating layers.

10. A semiconductor device comprising:
a substrate;
a semiconductor fin protruding from the substrate, wherein the semiconductor fin includes a first region and a second region on the first region;
a gate electrode on a side surface of the first region of the semiconductor fin;
a spacer in contact with a portion of the side surface of the second region of the semiconductor fin;
a gap fill insulating layer covering the gate electrode, wherein an upper surface of the spacer is higher than an upper surface of the gap fill insulating layer; and
a contact plug in contact with a semiconductor layer on a top of the semiconductor fin,
wherein a lower surface of the contact plug contacts the spacer,
wherein a top surface of the spacer is lower than a top surface of the second region of the semiconductor fin, wherein the lower surface of the contact plug is lower than the upper surface of the spacer.

11. The semiconductor device of claim 10, wherein the spacer has a curved side surface extending beyond the side surface of the gate electrode.

12. The semiconductor device of claim 10, wherein a lower surface of the spacer is convex and contacts an upper surface of the gate electrode.

13. The semiconductor device of claim 10, wherein the top surface of the spacer is in contact with the semiconductor layer on the top of the semiconductor fin.

14. The semiconductor device of claim 10, wherein a width of the spacer is greater than a width of an upper region of the gate electrode.

* * * * *